United States Patent [19]

Abe

[11] Patent Number: 4,525,597
[45] Date of Patent: Jun. 25, 1985

[54] CERAMIC LEADLESS PACKAGES AND A PROCESS FOR MANUFACTURING THE SAME

[75] Inventor: Shozo Abe, Tsuru, Japan

[73] Assignee: NGK Insulators, Ltd., Japan

[21] Appl. No.: 544,851

[22] Filed: Oct. 24, 1983

[30] Foreign Application Priority Data

Oct. 30, 1982 [JP]  Japan ............................. 57-190945

[51] Int. Cl.³ ..................... H01L 23/04; H01L 23/50
[52] U.S. Cl. ................................. 174/52 FP; 29/591; 357/80
[58] Field of Search .................. 174/52 PE, 52 FP; 357/73, 74, 80; 29/591

[56] References Cited

U.S. PATENT DOCUMENTS

| | | | |
|---|---|---|---|
| 3,404,214 | 10/1968 | Elliott | 174/52 PE |
| 3,404,215 | 10/1968 | Burks et al. | 174/52 PE |
| 3,471,753 | 10/1969 | Burks et al. | 174/52 PE |
| 3,483,308 | 12/1969 | Wakely | 174/52 PE X |
| 4,366,342 | 12/1982 | Breedlove | 174/52 FP |

Primary Examiner—Laramie E. Askin
Assistant Examiner—Terry Flower
Attorney, Agent, or Firm—Parkhurst & Oliff

[57] ABSTRACT

A ceramic leadless package for integrated circuits, which comprises a ceramic substrate having first and second opposite surfaces, a plurality of ceramic projections protruding from the first surface, a metallized layer provided on the end surface of each of the projections, an electrode portion for an electronic device provided in the central portion of the second surface, a plurality of metallized layers extending from the circumference of the substrate toward the electrode portion, and a side metallized layer connecting the above metallized portions in the first and second surfaces to each other. In the package of this type, the metallized layers of the first and second surfaces are concave and convex at a position corresponding to each projection, respectively, and a greater part of the metallized layers of the second surface are covered with an insulating layer.

5 Claims, 11 Drawing Figures

FIG_2
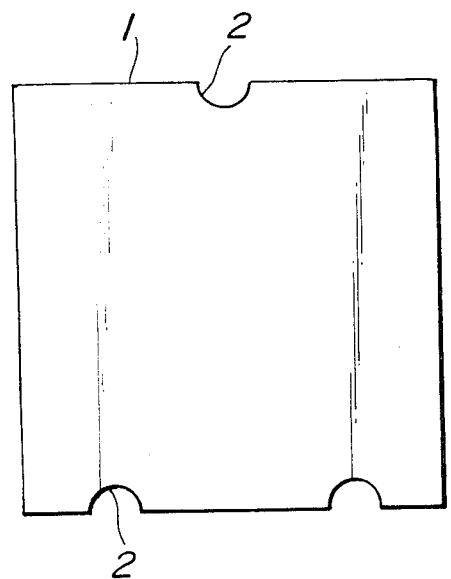
FIG_3
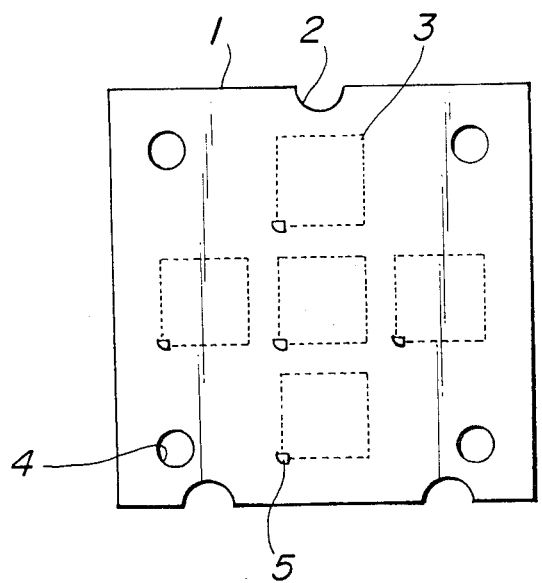

FIG_6
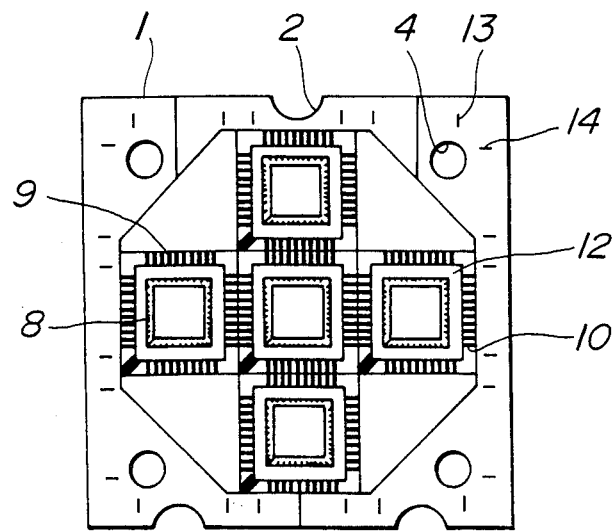
FIG_7
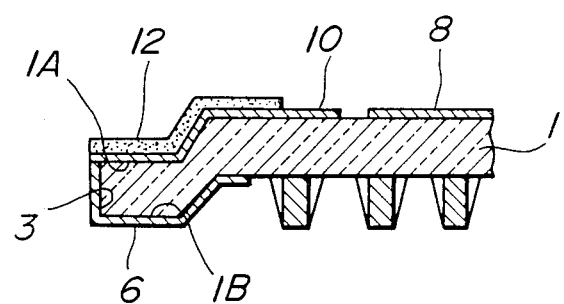

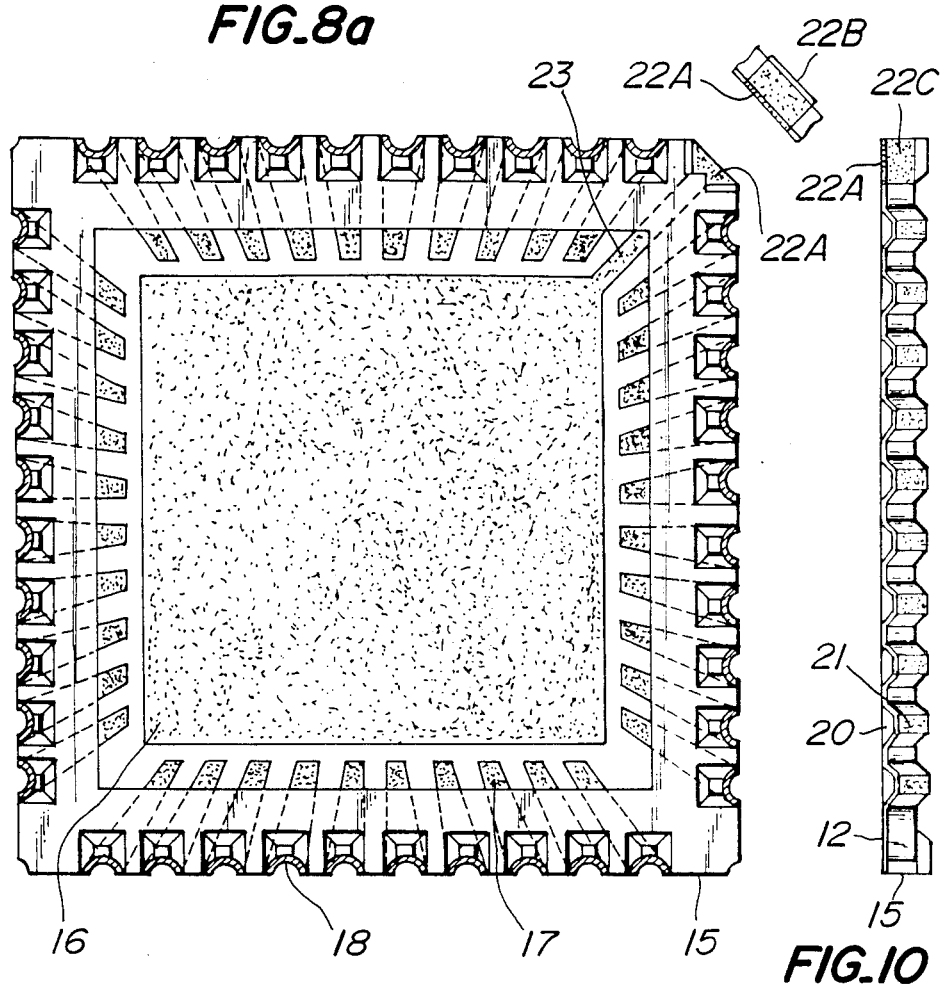

CERAMIC LEADLESS PACKAGES AND A PROCESS FOR MANUFACTURING THE SAME

BACKGROUND OF THE INVENTION (1) Field of the Invention

The present invention relates to a ceramic leadless package usable for mounting a small size electronic device such as a semiconductor or the like and connecting it to a circuit substrate. And also, the invention relates to a process for manufacturing such a ceramic leadless package.

(2) Description of the Prior Art

As the ceramic package of this type, there have hitherto been employed a laminated type chip carrier and a flat type chip carrier, but they have the following drawbacks: (1) When the top surface of the package is flat, for instance, as in the package described in U.S. Pat. No. 3,404,214, external terminals provided on the top surface of the package are substantially flush with the top surface of the package, so that it is necessary to separate these adjacent terminals from each other by grooves. If there is no groove, when the external terminals or the top surface of the package is soldered to another substrate, short circuit is apt to occur between the terminals due to the bridging of the solder.

(2) When the package is not provided on its side surface and bottom surface with connection conductors as in the abovementioned package, if the top surface of such a package is connected to another circuit substrate, the soldering for terminals cannot sufficiently be confirmed from the exterior and the soldered area is small, so that the adhesive strength becomes insufficient.

(3) When the package surface is flat as in the laminated type chip carrier or the flat type chip carrier, there remains substantially no space between the package surface and another circuit substrate after the package is connected to the circuit substrate, and hence electronic components cannot be attached to the mounting area occupied in the package, so that the packaging density for the circuit substrate is restricted. Moreover, since there is a limit on the connecting area between the top surface of the package and the circuit substrate, the heat dissipation is not achieved sufficiently.

(4) As disclosed in U.S. Pat. No. 3,483,308 (Japanese Patent Application Publication No. 49-41,901), there is proposed a supporting member for an electronic device, which is produced by subjecting a flat ceramic carrier body provided on its bottom surface with projections to a metallization. In this type of the package, conductors extending over the respective projections are formed after the molding or firing of the ceramic body, so that the mass-productivity is poor, and it is difficult to make the body lighter and thinner.

SUMMARY OF THE INVENTION

It is, therefore, an object of the invention to solve the above-mentioned drawbacks, and to provide a ceramic leadless package wherein a plurality of metallizing patterns and external terminals are printed on an unfired plate-like ceramic green sheet, subjected to a hot pressing so as to make a wave shape of the pattern, for instance, to make the top surface of the external terminal portion convex and the bottom surface thereof concave, and then fired to form external terminal portions as a conductor owing to the metallization of the above pattern.

According to the invention, there is the provision of a ceramic leadless package comprising a ceramic substrate having first and second opposite surfaces parallel to each other, a plurality of ceramic projections protruding from the first surface and separated from each other, a metallized layer provided on the end surface of each of the ceramic projections, an electrode portion for an electronic device such as a semiconductor provided on the central portion of the second surface so as to mount the electronic device on the second surface, a plurality of metallized layers extending from the circumference of the ceramic substrate toward the electrode portion for the electronic device, a side metallized layer connecting each metallized layer of the first surface to the corresponding each metallized layer of the second surface, wherein the metallized layer of the first surface and the metallized layer of the second surface correspondingly are convex and concave at a position corresponding to each ceramic projection and are connected to each other through the side metallized layer, and the metallized layers provided on the second surface are spaced from each other and extend toward the electrode portion for the electronic device provided on the central portion of the second surface, and the metallized layers existent in the concave portion and a greater part of the metallized layers extending toward the center of the second surface are covered with an insulating layer.

Another object of the invention is to provide a ceramic leadless package in which the electrode portion for the electronic device is provided with a metallized layer drawn from this electrode portion to a corner of the ceramic substrate and serving both as a plating electrode and as an index corner.

Still another object of the invention is to provide a ceramic leadless package in which the metallized layer provided on each ceramic projection extends over the projection toward the center of the first surface to a certain extent.

A further object of the invention is to provide a ceramic leadless package in which the metallized layer drawn from the electrode portion for the electronic device to the corner of the ceramic substrate is provided with a metallized layer extending over the side and back surfaces of the corner.

According to the invention, there is further provided a process for manufacturing a ceramic leadless package, which comprises steps of: punching a ceramic green sheet at predetermined positions to form through-holes for side metallized layers corresponding to a ceramic leadless package unit; printing the inner circumferential surface of each of the through-holes with a metallizing paste to form a side metallizing layer; screen-printing a first surface of the ceramic green sheet with a metallizing paste to form a plurality of metallizing layers for connecting to an external electronic circuit, each extending from the circumference of the through-hole and being electrically connected to the side metallizing layer and at the same time screen-printing a second surface of the ceramic green sheet with a metallizing paste to form an electrode portion for an electronic device to be mounted thereon and a pluality of metallizing layers, each extending from the circumference of the through-hole toward the electrode portion for the electronic device and being electrically connected to the side metallizing layer; screen-printing the metallizing layers of the second surface except a desired portion of the metallizing layer the electrode portion for the electronic device with an insulating paste to form an insulating layer; hot-pressing only a region including the through-hole and a part of the insulating layer adjacent thereto up to a given depth to protrude a part of each metallizing layer from the first surface of the ceramic green sheet; and firing and plating the resulting pressed product.

BRIEF DESCRIPTION OF THE DRAWINGS

The invention will now be described in detail with reference to the accompanying drawings, wherein:

FIG. 2 is a plan view of a ceramic green sheet to be used in the invention;

FIG. 3 is a plan view illustrating such a state that through-holes are punched in the ceramic green sheet;

FIG. 6 is a plan view illustrating such a state that a part of the ceramic green sheet is covered with an insulating layer;

FIG. 7 is an enlarged sectional view of the outer peripheral portion of the metallizing pattern in the package after the hot-pressing; and FIGS. 8a, 8b, 9 and 10 are plan, fragmentary, rear and side views of the package illustrating such a state that the green sheet is fired, subjected to a plating on the metallizing layers and separated into individual sections, respectively.

DETAILED DESCRIPTION OF THE INVENTION

Figure 1:
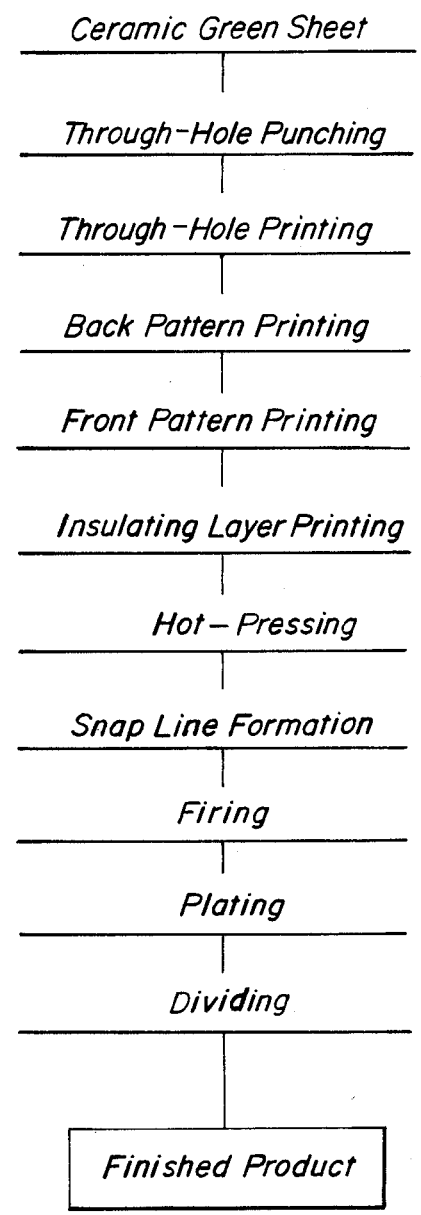
FIG. 1 is a flow sheet illustrating the process for manufacturing ceramic leadless packages according to the invention.

The present invention will successively be described on every steps in accordance with the flow sheet shown in FIG. 1. First, alumina powder, a flux, an organic binder, a plasticizer and a solvent are mixed at a given mixing ratio to prepare a ceramic slurry, which is shaped into a tape by means of a knife coater. Then, the resulting tape is dried and cut in a given length to form a plurality of unfired ceramic green sheets 1 as shown in FIG. 2.

In FIG. 2, a reference numeral 2 denotes a notch for determining a working position in the side portion of the ceramic green sheet. As shown in FIG. 3, plural sets of through-holes 3 penetrating from one surface to the other, each set corresponding to a contour of a ceramic leadless package body, are punched at a predetermined interval in the green sheet 1. A reference numeral 4 denotes a guide hole for use in printing and hot-pressing steps, which is formed in each corner of the green sheet 1 during the punching, and a reference numeral 5 denotes an index to be used as a mark for actually mounting a ceramic package.

In the next step, the inner surface of each of the through-holes 3 is printed from one surface of the green sheet 1 to the other thereof with a metallizing paste. As the metallizing paste, there may be used the conventionally known tungsten-base paste and molybdenum-base paste.

Figure 4:
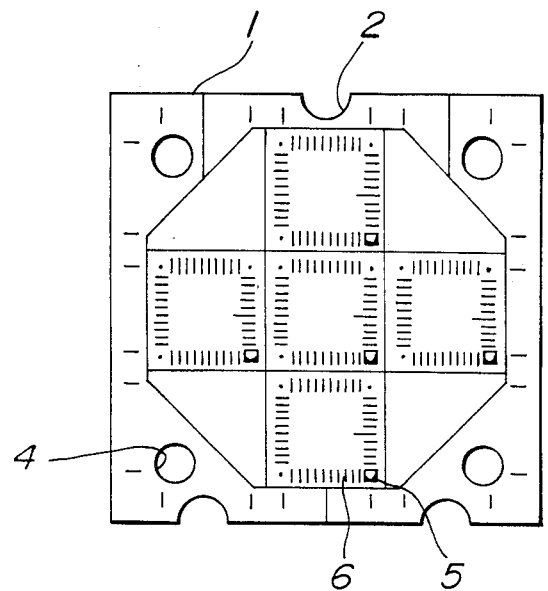
FIGS. 4 and 5 are rear and plan views illustrating such states that patterns are printed with a metallizing paste on the back and front surfaces of the ceramic green sheet, respectively.

Thereafter, as shown in FIG. 4, a back pattern 6 is printed in a thickness of 10-50 μm on the first surface of the green sheet 1 with the metallizing paste.

Figure 5:
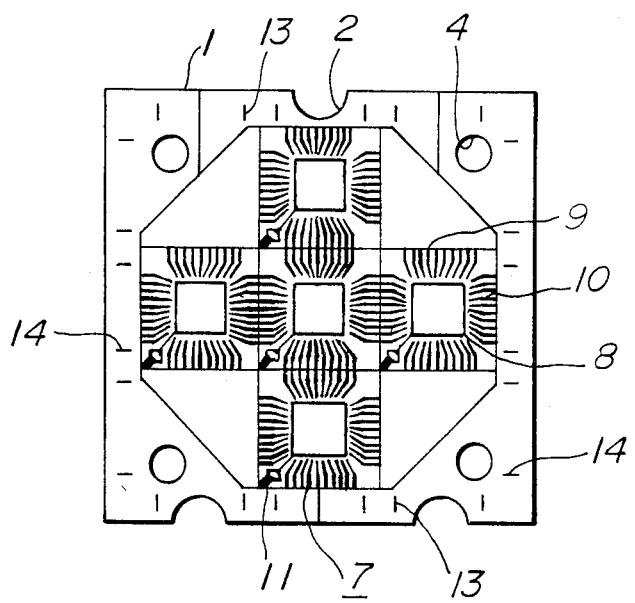
Figure 9:
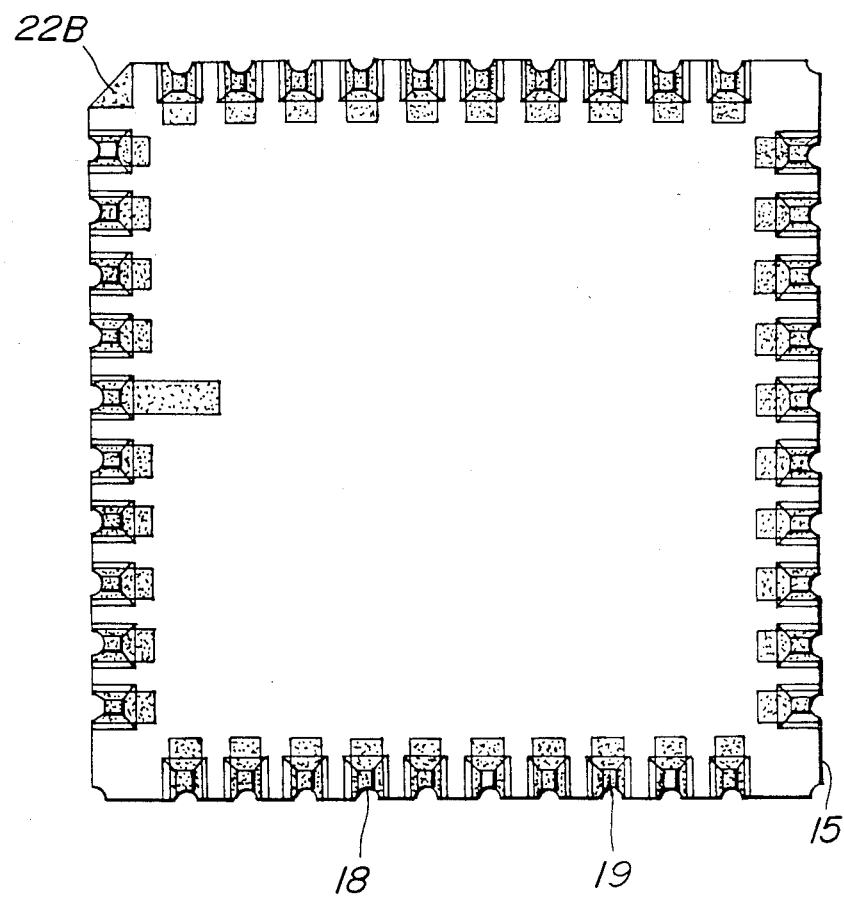

Next, the green sheet 1 having the printed back pattern 6 is turned over, on which is printed a front pattern 7 as shown in FIG. 5. A reference numeral 8 is a metallizing portion printed in a central part of a contour 9 of a section constituting the front pattern 7, which corresponds to an electrode portion for mounting an electronic device thereon. Peripheral pattern 10 corresponding to side electrodes of the section in the front pattern 7 are separated from each other and metallize-printed so as to extend at least toward the printed metallizing portion 8 for mounting the electronic device. A reference numeral 11 is an index pattern printed at a corner of the section in the front pattern 7 and connected to the printed metallizing portion 8 through a single metallizing line, which is used as an electrode for plating after the firing. The front pattern 7 is also printed in a thickness of 10-50 μm with the metallizing paste.

The order of the metallize-printing for the back pattern, front pattern and the like on the ceramic green sheet is not always the same as shown in FIG. 1, but may be determined in view of the efficiency of the printing steps.

Then, as shown in FIG. 6, an insulating layer pattern 12 is formed by covering the middle areas of the peripheral patterns 10 of FIG. 5 with an insulating paste. In FIG. 6, the pattern 12 is shown as a white portion corresponding to the middle areas of the peripheral patterns 10. The insulating layer 12 is printed in a thickness of 10-50 μm.

Next, only a part of each of the peripheral patterns 10 covered with the insulating layer 12 and located near the through-hole 3 is hot-pressed in a direction of the back surface (i.e. a first surface) from the front surface (i.e. a second surface) of the green sheet 1 so as to make the front surface concave and the back surface convex, whereby the separation between the adjoining peripheral patterns 10 is further ensured.

In FIG. 7 is enlargedly and sectionally shown a peripheral part of the ceramic green sheet 1 after the hot-pressing, wherein reference numerals 1A and 1B show the concave and convex parts of the ceramic green sheet 1 and the inner surface of the through-hole 3 has a printed metallizing layer.

The hot-pressing of the pripheral pattern as mentioned above is carried out at a temperature of 50°-100° C. under a pressure of 10-100 kg/cm².

Next, the ceramic green sheet 1 is subjected to knife-cutting in transverse and longitudinal directions to form snap lines. For this purpose, there are used marks 13 and 14 for the formation of snap lines capable of dividing the ceramic sheet into individual ceramic leadless packages.

Next, the ceramic green sheet 1 is fired at a temperature of about 1,500° to 1,600° C. in a reducing atmosphere, whereby the printed metallizing layers 6, 7, 8, 10 and 11 are changed into electrically conductive metallized layers.

After the printed metallizing portions in the front and back patterns 7 and 6 and the through-holes 3 are changed into the metallized layers by firing, the resulting ceramic sheet is plated with nickel, gold, silver or the like at positions corresponding to the metallized layers. As the plating method, either an electroplating or electroless plating may be used. In this case, the portions of the metallized layers not covered with the insulating layer 12 are plated.

In the next step, the ceramic substrate is divided along the snap lines passing through-holes punched in the first step to obtain ceramic leadless packages as a finished product.

The division of the ceramic substrate into the ceramic leadless packages may be performed prior to the plating. Alternatively, when the division is carried out by a laser scribing method, the formation of snap lines as described above is not always required.

The detail of the resulting ceramic leadless package is shown in FIGS. 8a, 8b, 9 and 10. FIGS. 8a, 8b, 9 and 10 are a plan view of the front surface (second surface), a fragmentary view, a rear view of the back surface (first surface), and the side view in the finished product, respectively.

In FIGS. 8a, 8b, 9 and 10, a reference numeral 15 is a ceramic leadless package body, a reference numeral 16 an electrode portion for an electronic device provided in the central part of the body, a reference numeral 17 an electrode corresponding to the peripheral pattern formed on the front surface (second surface), a reference numeral 18 a through-hole electrode provided on the through-hole, a reference numeral 19 an electrode provided on the convex part of the back surface (first surface), and reference numerals 20 and 21 concave and convex parts of the ceramic substrate produced by the hot-pressing. The electrode 17 is electrically connected to the corresponding electrode 19 through the through-hole electrode 18. A reference numeral 22A indicates an index corner of the front surface, a reference numeral 22B indicates an index corner of the back surface, and a reference numeral 22C indicates a side portion index corner connecting the index corners 22A and 22B. A reference numeral 23 is a lead electrode for connecting the index corner 22A to the electrode portion 16.

Since the ceramic leadless package according to the invention can directly be attached to another circuit substrate, it is not necessary to attach any lead members to the ceramic leadless package. Therefore, an integrated circuit may properly be mounted on the ceramic leadless package before or after the division of the ceramic substrate.

According to the invention, the ceramic green sheet is shaped into a plate-like tape, and the punching of through-hole, the metallize printings for through-hole, back pattern and front pattern, and the printing for insulating layer are all made on the plate-like ceramic green sheet, so that the tape-shaping, the metallize-printing and the insulating layer-printing can be performed extremely effectively. Further, since the provision of the insulating layer enhances the electric insulation between the adjacent peripheral patterns and also smoothens the unevenness due to the gauges of the peripheral patterns, it contributes to improve the air-tightness in the sealing of the electronic device and the anti-corrosion property of the peripheral patterns and further prevents the damaging of the printed peripheral patterns in the hot-pressing. Since the peripheral pattern electrodes on the front and back surfaces are correspondingly pressed in such a manner that they are concave in the front surface (second surface) and convex in the back surface (first surface), short circuit is not caused between the adjacent peripheral pattern electrodes at the front surface. That is, ceramic leadless packages of thin and light type can be mass-produced according to the invention.

Moreover, since the electrode portions at the front surface are concave in the package according to the invention, solder-bridging hardly occurs in the soldering and also the product yield is enhanced, and the area for soldering can be widened and the connection state may be confirmed easily from the exterior.

In addition, when the electronic device is mounted to the package and sealed therein, the sealing strength and airtightness are excellent because the peripheral portion of the package provided with the insulating layer is concave.

Further, since the package according to the invention is thin and the electrode portions at the back surface thereof are convex to give a space in the bottom, the packaging of another circuit substrate can be attained three-dimensionally, so that the packaging density can be increased and the heat dissipation can be improved. Thus, according to the invention, the thin and light type ceramic leadless packages can cheaply be provided in industry.

What is claimed is:

1. A ceramic leadless package comprising a ceramic substrate having first and second opposite surfaces parallel to each other, a plurality of ceramic projections protruding from the first surface and separated from each other, a metallized layer provided on the end surface of each of the ceramic projections, an electrode portion for an electronic device provided on the central portion of the second surface so as to mount the electronic device thereon, a plurality of metallized layers extending from the circumference of the ceramic substrate toward the electrode portion for the electronic device, a side metallized layer connecting each metallized layer of the first surface to the corresponding each metallized layer of the second surface, wherein the metallized layer of the first surface and the metallized layer of the second surface correspondingly are convex and concave at a position corresponding to each ceramic projection and are connected to each other through the side metallized layer, and the metallized layers provided on the second surface are separated from each other and extend toward the electrode portion for the electronic device provided on the central portion of the second surface, and the metallized layers existent in the concave portions and a greater part of the metallized layers extending toward the center of the second surface are covered with an insulating layer.

2. A ceramic leadless package as claimed in claim 1, wherein the electrode portion for the electronic device is provided with a metallized layer drawn from this electrode portion to a corner of the ceramic substrate and serving both as a plating electrode and as an index corner.

3. A ceramic leadless package as claimed in claim 1 or 2, wherein the metallized layer provided on each ceramic projection extends over the projection toward the center of the first surface to a certain extent.

4. A ceramic leadless package as claimed in claim 2, wherein the metallized layer drawn from the electrode portion for the electronic device to the corner of the ceramic substrate is provided with a metallized layer extending over the side and back surfaces of the corner.

5. A process for manufacturing a ceramic leadless package which comprises steps of:
punching a ceramic green sheet at predetermined positions to form through-holes for side metallized layers corresponding to a ceramic leadless package unit;
printing the inner circumferential surface of each of the through-holes with a metallizing paste to form a side metallizing layer;

screen-printing a first surface of the ceramic green sheet with a metallizing paste to form a plurality of metallizing layers for connecting to an external electronic circuit, each extending from the circumference of the through-hole and being electrically connected to the side metallizing layer and at the same time screen-printing a second surface of the ceramic green sheet with a metallizing paste to form an electrode portion for an electronic part to be mounted thereon and a plurality of metallizing layers, each extending from the circumference of the through-hole toward the electrode portion for the electronic part and being electrically connected to the side metallizing layer;

screen-printing the metallizing layers of the second surface except a desired portion of the metallizing layer near the electrode portion for the electronic part with an insulating paste to form an insulating layer;

hot-pressing only a region including the through-hole and a part of the insulating layer adjacent thereto up to a given depth to protrude a part of each metallizing layer from the first surface of the ceramic green sheet; and firing and plating the resulting pressed product.

* * * * *